United States Patent
Liaw (10) Patent No.: US 7,514,757 B2
(45) Date of Patent: Apr. 7, 2009

(54) MEMORY FORMATION WITH REDUCED METALLIZATION LAYERS

(75) Inventor: Jhon-Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 132 days.

(21) Appl. No.: 11/513,958

(22) Filed: Aug. 31, 2006

(65) Prior Publication Data

US 2008/0121942 A1 May 29, 2008

(51) Int. Cl.
*H01L 27/088* (2006.01)
(52) U.S. Cl. .................. 257/393; 257/27.098
(58) Field of Classification Search .......... 257/314–315
See application file for complete search history.

(56) References Cited

U.S. PATENT DOCUMENTS

| | | | | |
|---|---|---|---|---|
| 5,128,744 A * | 7/1992 | Asano et al. | ................ | 257/508 |
| 6,091,630 A * | 7/2000 | Chan et al. | ................... | 365/156 |
| 6,399,495 B1 * | 6/2002 | Tseng et al. | ................ | 438/687 |
| 6,441,448 B1 * | 8/2002 | Maeda et al. | ................ | 257/392 |
| 6,455,884 B1 * | 9/2002 | Chan et al. | .................. | 257/296 |
| 6,635,937 B2 * | 10/2003 | Ootsuka et al. | ............. | 257/379 |
| 6,661,043 B1 * | 12/2003 | Huang et al. | ................. | 257/243 |
| 7,006,370 B1 * | 2/2006 | Ramesh et al. | ................ | 365/63 |
| 2002/0027810 A1 * | 3/2002 | Iida et al. | ............... | 365/189.11 |
| 2004/0232497 A1 * | 11/2004 | Akiyama et al. | ............ | 257/390 |
| 2006/0076600 A1 * | 4/2006 | Nakabayashi et al. | ....... | 257/298 |
| 2007/0080387 A1 * | 4/2007 | Liu et al. | .................... | 257/303 |

* cited by examiner

*Primary Examiner*—Bilkis Jahan
(74) *Attorney, Agent, or Firm*—Slater & Matsil, L.L.P.

(57) ABSTRACT

A semiconductor structure includes a static random access memory (SRAM) cell comprising a first pull-up MOS device, a first pull-down MOS device and a first pass-gate MOS device, a first metallization layer, and an inter-layer dielectric (ILD) underlying the first metallization layer, wherein the ILD comprises an upper portion and a lower portion, a first first-layer contact in the lower portion of the ILD and connecting at least two of the first pull-up MOS device, the first pull-down MOS device and the first pass-gate MOS device. The first first-layer contact is physically isolated from second layer contacts in the upper portion of the ILD. The semiconductor structure further includes a second first-layer contact in the lower portion of the ILD, and a second-layer contact having at least a portion on the second first-layer contact, wherein the second layer contact electrically connects the second first-layer contact.

18 Claims, 8 Drawing Sheets

MEMORY FORMATION WITH REDUCED METALLIZATION LAYERS

TECHNICAL FIELD

This invention relates generally to semiconductor devices, and more particularly to memories, and even more particularly to layout design and manufacturing methods of memories.

BACKGROUND

Static random access memory (SRAM) cells are popular for their high performance and low cost. In cache applications, particularly at L1 and L2 levels, six-transistor (6T) or eight-transistor (8T) SRAM cells are widely employed due to their high speed and process compatible cell structure. In applications requiring high storage amounts, however, for example, in L3 cache or memories with 32M bits or higher, one-transistor (1T) RAM cells with dynamic random access memory (DRAM) cells are preferred for their low chip area requirement. To achieve both high performance and high storage, SRAM and 1T DRAM memories are often integrated on one chip.

The conventional memory chip formation, however, suffers drawbacks. Typically, the local interconnection in an SRAM cell, for example, a drain region of a pull-up MOS device and a drain region of a pull-down device are typically connected using the first metallization layer (M1). Bitlines, wordlines and power lines thus have to use metallization layers two and three. Therefore, at least three metallization layers are needed just for the formation of SRAM cells. Another drawback is that contact plugs connecting the source/drain regions of MOS devices in SRAM cells are tall contact plugs extending from M1 all the way down to source/drain regions of MOS devices. The long contact plugs combined with the high device density of memory cells results in high parasitic capacitances. RC delay is thus increased.

What is needed in the art, therefore, is a memory structure that combines 1T DRAM and 6T (or more) SRAM therein to take advantage of the benefits associated with high performance and high density while at the same time overcoming the deficiencies of the prior art.

SUMMARY OF THE INVENTION

In accordance with one aspect of the present invention, a semiconductor structure includes a static random access memory (SRAM) cell comprising a first pull-up MOS device, a first pull-down MOS device and a first pass-gate MOS device, a first metallization layer, and an inter-layer dielectric (ILD) underlying the first metallization layer, wherein the ILD comprises an upper portion and a lower portion, a first first-layer contact in the lower portion of the ILD and connecting at least two of the first pull-up MOS device, the first pull-down MOS device and the first pass-gate MOS device. The first first-layer contact is physically isolated from second layer contacts in the upper portion of the ILD. The semiconductor structure further includes a second first-layer contact in the lower portion of the ILD, and a second-layer contact having at least a portion on the second first-layer contact, wherein the second layer contact electrically connects the second first-layer contact.

In accordance with another aspect of the present invention, a semiconductor structure includes a static random access memory (SRAM) cell comprising a pull-up MOS device, a pull-down MOS device and a pass-gate MOS device, an inter-layer dielectric (ILD) over the pull-up MOS device, the pull-down MOS device and the first pass-gate MOS device, a first metallization layer on the ILD wherein the first metallization layer is a lowest metallization layer, a first-layer contact in the ILD, wherein a top surface of the first-layer contact is vertically spaced apart from a bottom of the first metallization layer, and wherein the first-layer contact interconnects the first pull-up MOS device, the first pull-down MOS device and the first pass-gate MOS device. The semiconductor structure further includes a dynamic random access (DRAM) cell and a capacitor in the DRAM cell, wherein the capacitor is in the ILD and has a bottom surface substantially level with the top surface of the first-layer contact.

In accordance with yet another aspect of the present invention, a semiconductor structure includes a static random access memory (SRAM) cell comprising a pull-up MOS device, a pull-down MOS device and a pass-gate MOS device, an inter-layer dielectric (ILD) over the pull-up MOS device, the pull-down MOS device and the first pass-gate MOS device, a first metallization layer on the ILD, wherein the first metallization layer is a lowest metallization layer, a wordline, a bitline, an inversed bitline having an inversed phase relative to the bitline, an inversed bitline having an inversed phase relative to the bitline, a Vcc power source line, and a Vss power source line, wherein the wordline is in the first metallization layer, and wherein the bitline, the inversed bitline, the Vcc power source line and the Vss power source line are in a second metallization layer.

The advantageous features of the present invention include reduced metallization layers for forming SRAM cells, reduced RC delay due to shortened contacts and full compatibility of the formation process of SRAM cells into the formation of DRAM cells.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the preferred embodiment, static random access memory (SRAM) cells and one-transistor (1T) dynamic random access memory (DRAM) cells are integrated on one chip. A chip thus includes at least a logic region for forming a logic circuit (such as a CPU, digital signal processing (DSP) unit, and the like), an SRAM region for forming an SRAM cell, and a DRAM region for forming a DRAM cell. For illustration purposes, throughout the description, a six-transistor (6T) SRAM cell and a 1T DRAM cell are discussed. It should be appreciated, however, that the teaching provided by the present invention is readily available for the design and manufacturing of memory cells with different numbers of transistors.

Figure 1:
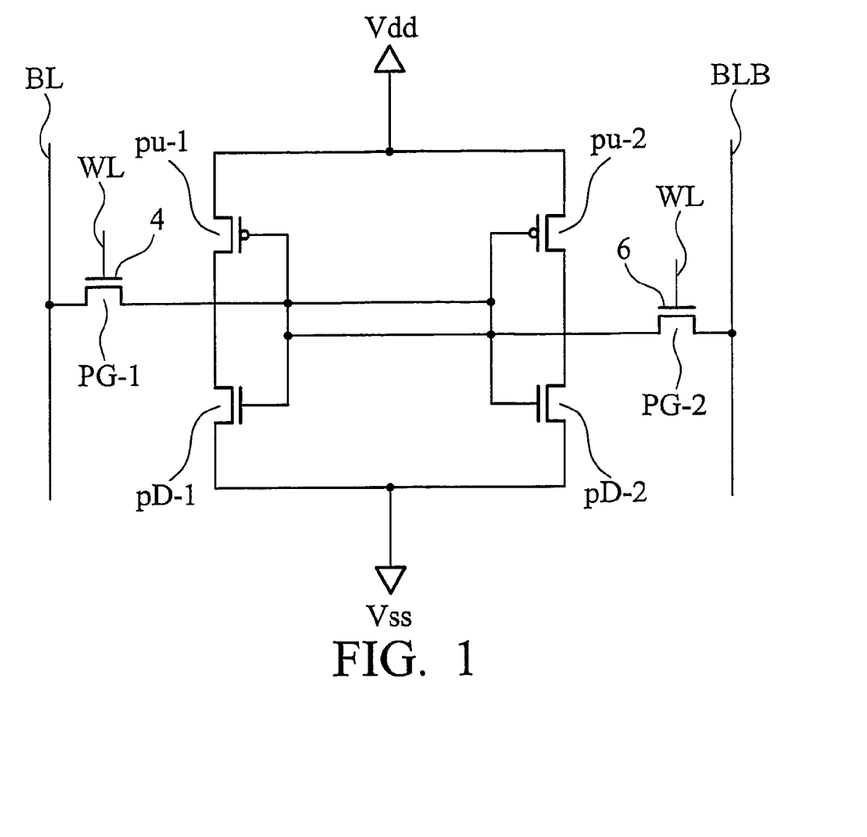
FIG. 1 illustrates a circuit diagram of a six-transistor SRAM cell.

FIG. 1 schematically illustrates an exemplary circuit diagram of a typical 6T SRAM cell, which includes pass-gate MOS devices PG-1 and PG-2, pull-up MOS devices PU-1 and PU-2, and pull-down MOS devices PD-1 and PD-2. Gates 4 and 6 of the respective pass-gate MOS devices PG-1 and PG-2 are controlled by wordlines WL that determines whether the current SRAM cell is selected or not. A latch formed of pull-up MOS devices PU-1 and PU-2 and pull-down MOS devices PD-1 and PD-2 stores a state. The stored state can be read through bitlines, namely bitline BL and bitline-bar BLB, wherein bitline-bar BLB has an inversed phase relative to bitline BL.

Figure 2:
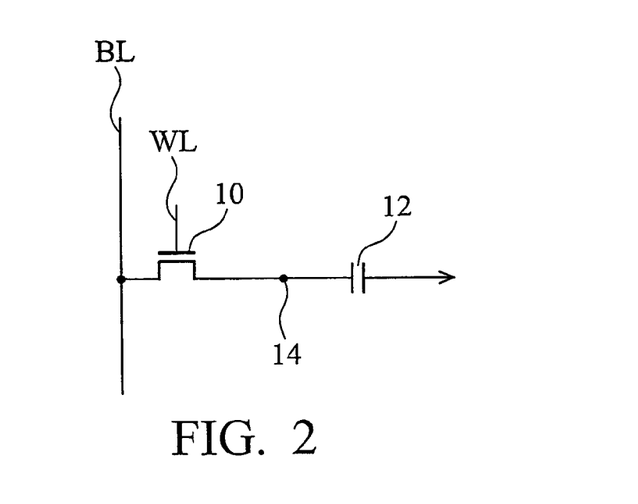
FIG. 2 illustrates a circuit diagram of a one-transistor DRAM cell.

FIG. 2 illustrates a circuit diagram of a 1T DRAM cell, which includes a MOS device 10 and a metal-insulator-metal (MIM) capacitor 12. Charges are stored on node 14. By applying a high voltage on a wordline WL, MOS device 10 may be turned on. Depending on the voltage change on bitline BL after MOS device 10 is turned on, the state of the 1T DRAM cell may be determined.

Figure 3:
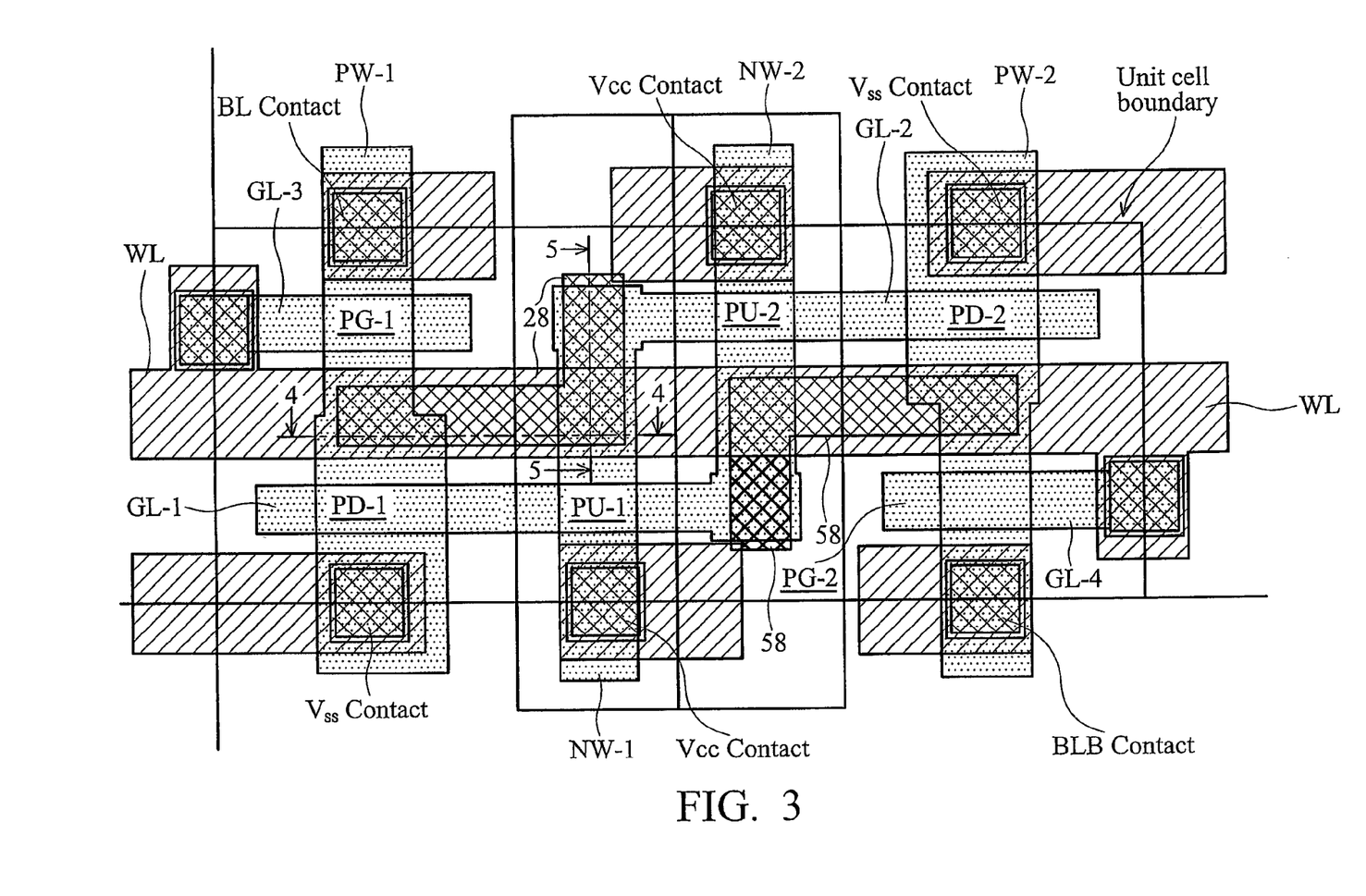
FIG. 3 illustrates a layout of the six-transistor SRAM cell shown in FIG. 1.

FIG. 3 illustrates an exemplary layout of the 6T SRAM cell shown in FIG. 1, wherein the "unit cell boundary" marks the boundary of a unit SRAM cell. In the preferred embodiment, a first gate line GL-1 is used for forming gate electrodes of MOS device PU-1 and PD-1. A second gate line GL-2 is used for forming gate electrodes of MOS device PU-2 and PD-2. Gate lines GL-3 and GL-4 are used for forming gate electrodes of pass gate MOS devices PG-1 and PG-2, respectively. P-well region PW-1 and gate lines GL-1 and GL-3 form NMOS devices PD-1 and PG-1, respectively. Similarly, P-well region PW-2 and gate lines GL-2 and GL-4 form PMOS devices PD-2 and PG-2, respectively. Conversely, N-well region NW-1 and gate line GL-1 form MOS device PU-1, while N-well region NW-2 and gate line GL-2 form MOS device PU-2. FIG. 3 illustrates that N-well regions NW-1 and NW-2 are two separate regions. Alternatively, these two regions may be formed as one interconnected region by forming a connecting N-well between the two N-well regions, for example, in a substrate region directly under the word-line WL.

A first-layer contact 28, which is a local connection, is illustrated with a diamond pattern. First-layer contact 28 has an L-shape, wherein one of its two legs (horizontal leg) connects a source region of MOS device PG-1, a drain region of MOS device PD-1 and a drain region of MOS device PU-1, while a second leg further connects these regions to the gate electrode of MOS device PU-2.

Figure 4:
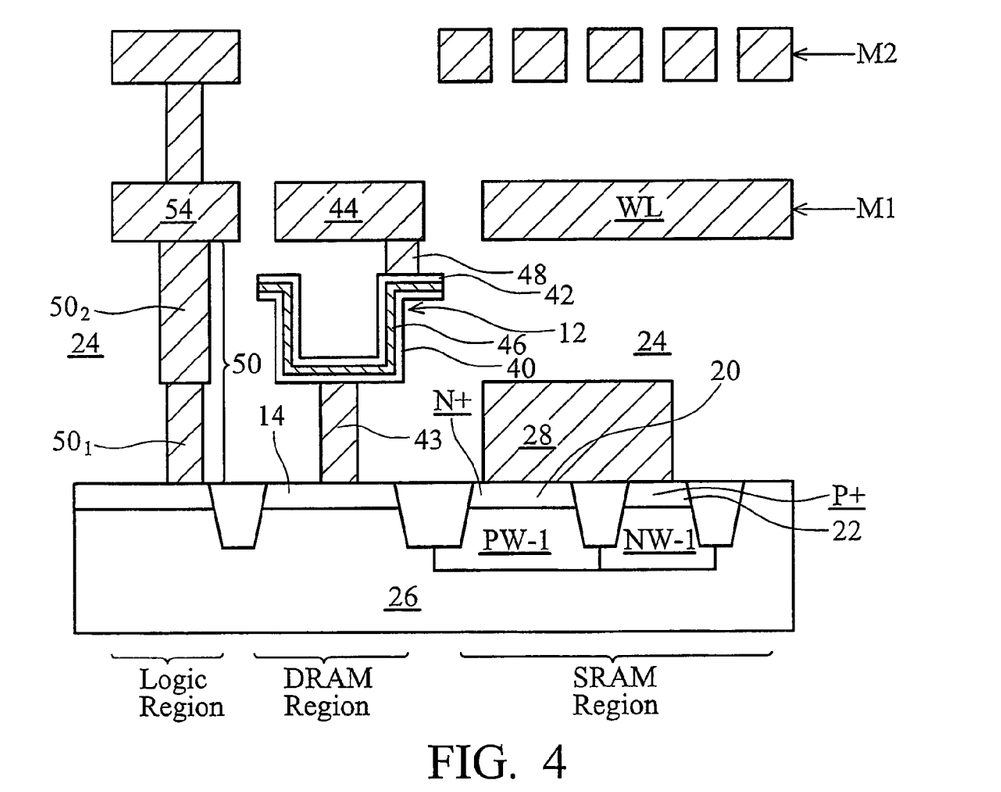
FIG. 4 illustrates a cross-sectional view of the six-transistor SRAM cell and the one-transistor DRAM cell.

FIG. 4 illustrates a cross-sectional view of a portion of the structure shown in FIG. 3, wherein the cross-sectional view is taken along a line 4-4 in FIG. 3 and is shown in an SRAM region. FIG. 4 further includes a capacitor, which has been shown in FIG. 2, in a DRAM region. In addition, a portion of an interconnect structure in the logic circuit is shown in a logic region. An inter-layer dielectric (ILD) 24 insulates the devices formed on semiconductor substrate 26 from the overlying metallization layers. An N+ region 20, which includes a drain region of MOS device PD-1 and a source region of MOS device PG-1, is formed in a P-well region PW-1. A P+ region 22, which includes the drain region of MOS device PU-1, is formed in an N-well region NW-1. N+ region 20 and P+ region 22 are connected by a first-layer contact 28, wherein the name first-layer refers to the first layer (or lower portion) of ILD 24. Please note that as distinct from typical prior art contacts, which extend from the first metallization layer M1 to the drain regions (more likely silicide regions), first-layer contact 28 and other local connections only occupy a lower portion of ILD 24. An inter-cell connection, for example, word-line WL, may thus be formed in the first metallization layer M1. As a comparison, in conventional SRAM cells, N+ region 20 and P+ region 22 are interconnected by two contact plugs, which further connect a metal line in the first metallization layer M1.

In the DRAM region, capacitor 12 is formed in inter-layer dielectric 24 and between the substrate 26 and the first metallization layer M1. Referring back to FIG. 2, capacitor 12 has one of the electrodes connected to a source region of a MOS device 10, wherein the source region 14 is schematically illustrated in FIG. 4. Referring again to FIG. 4, a bottom electrode 40 of capacitor 12 is connected to source region 14 through a contact 43. A top electrode 42 is preferably connected to a metal line 44 in the first metallization layer M1 through a contact 48. The top electrode 42 and bottom electrode 40 are separated by an insulator 46.

In the logic region, a contact 50 is illustrated. Contact 50 preferably includes two portions, a first-layer contact $50_1$ and a second-layer contact $50_2$. Contact 50 is further connected to a metal line 54 in the first metallization layer M1.

Figure 5:
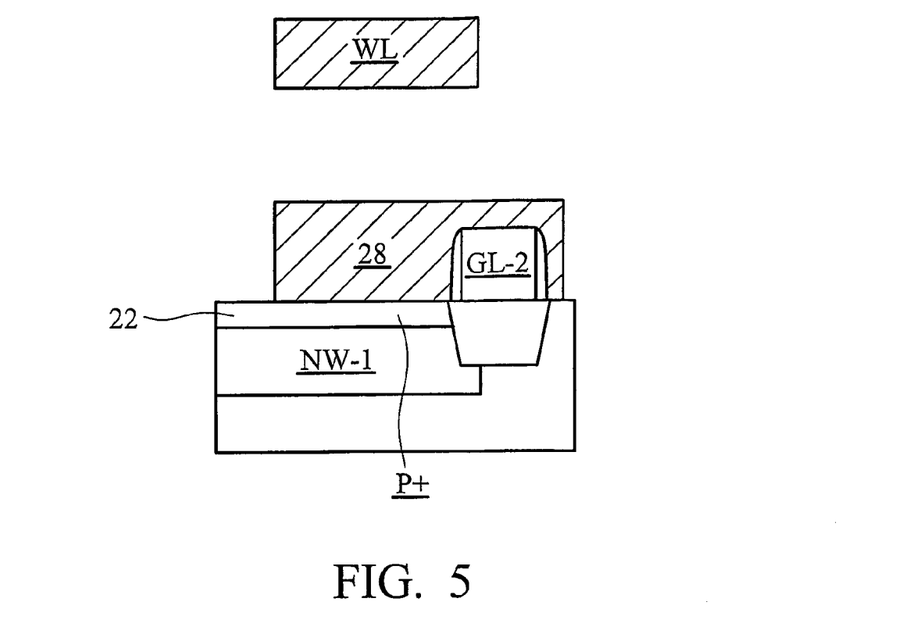
FIG. 5 illustrates a cross-sectional view of a first-layer contact, wherein the cross-sectional view is taken along a line 5-5 in FIG. 2.

FIG. 5 illustrates a cross-sectional view of a second leg of the L-shaped first-layer contact 28 as shown in FIG. 3, wherein the cross-sectional view is taken along a line 5-5. It shows that first-layer contact 28 forms a butted contact connecting the drain region 22 of MOS device PU-1 to gate line GL-2. First-layer contact 28 only occupies the lower portion of ILD 24. However, it has a thickness greater than a height of the gate stacks of MOS devices.

Figure 6:
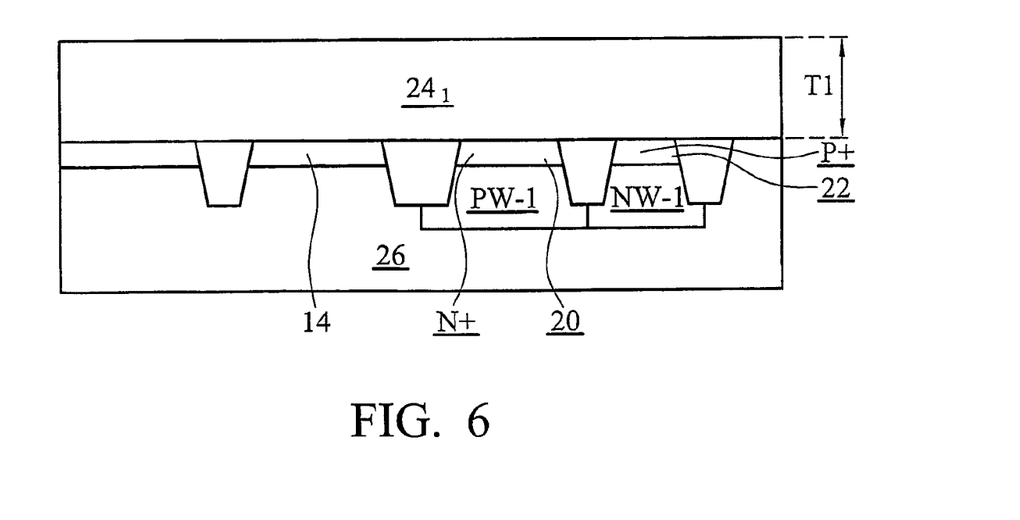
FIGS. 6 through 10 are cross-sectional views of intermediate stages in the manufacturing of the structure shown in FIG. 4.

The formation of the structure shown in FIG. 4 and FIG. 5 is briefly illustrated in FIGS. 6 through 10. FIG. 6 illustrates a structure after the formation of MOS devices, wherein only source/drain regions 14, 20 and 22, as previously discussed, are shown. A first inter-layer dielectric (ILD) $24_1$ is blanket formed. First ILD $24_1$ preferably has a thickness T1 of greater than the heights of the gate stacks (not shown in FIG. 6, please refer to FIG. 5) of the MOS devices, but less than the thickness of typical ILD layers. Preferably, the thickness T1 is between about 1500 Å and about 7000 Å.

Figure 7:
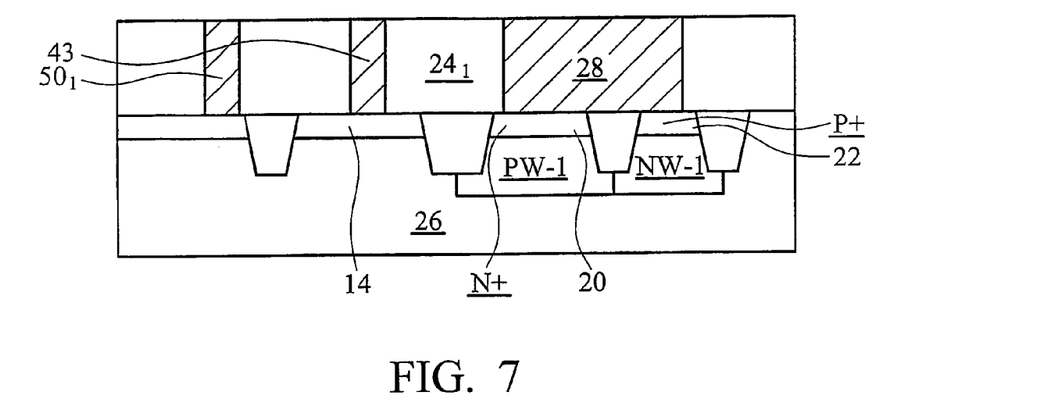

Openings are then formed in ILD $24_1$ to expose the source/drain regions (more likely source/drain silicide regions). The openings are then filled with conductive materials, such as tungsten, aluminum, AlCu, copper, TiN, TiW, TaN, and combinations thereof, forming contacts $50_1$, 43 and 28. The resulting structure is shown in FIG. 7.

Figure 8:
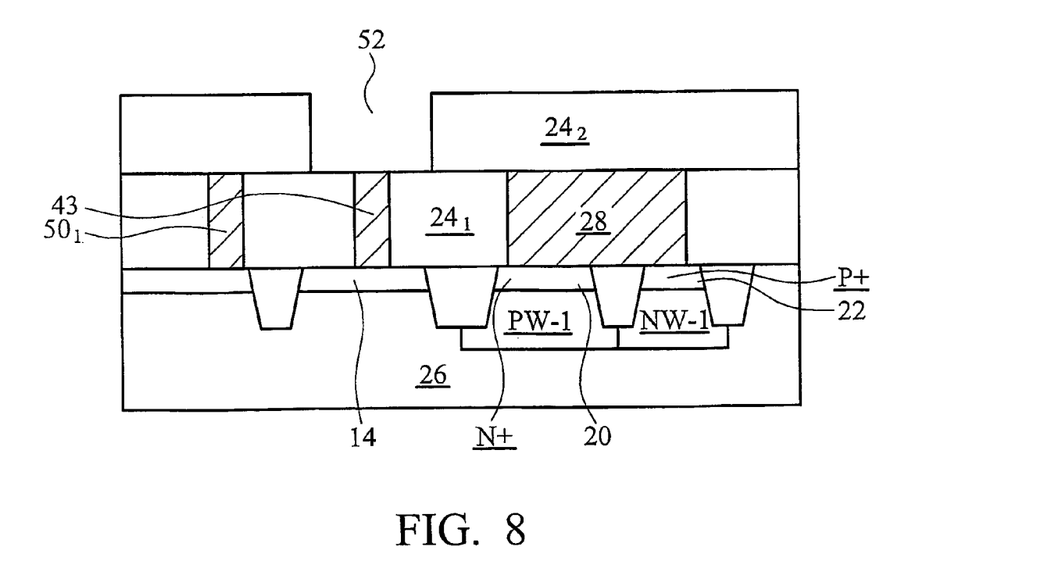

FIG. 8 illustrates the formation of a second ILD layer $24_2$ and an opening 52 formed in the second ILD layer $24_2$. ILD layer $24_2$ is preferably formed using similar dielectric materials as ILD layer $24_1$, although different material can be used. Contact 43 is exposed through the bottom of opening 52.

Figure 9A:
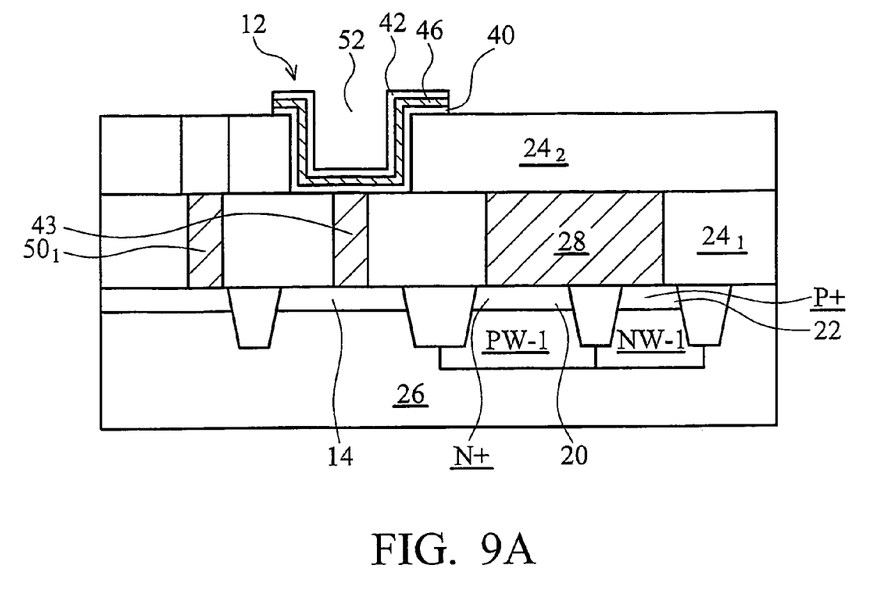
Figure 9B:
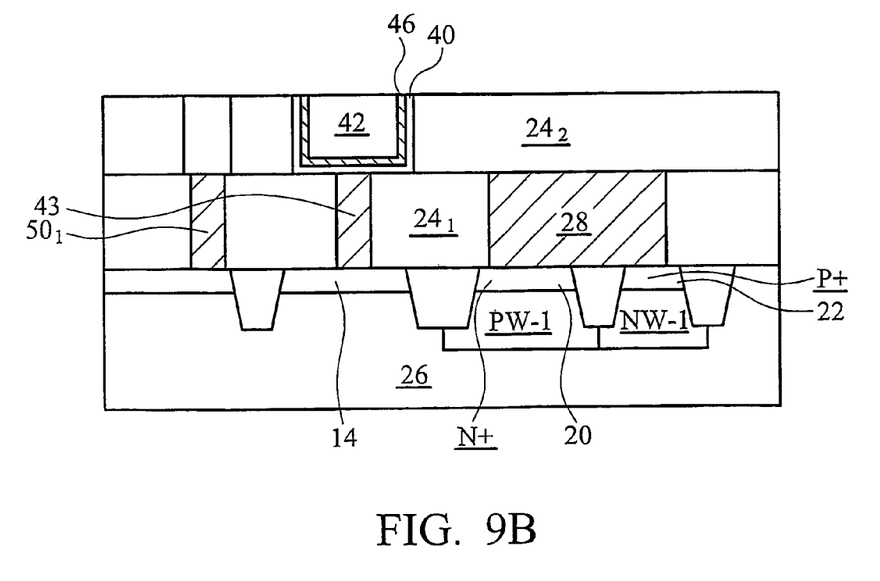

In FIG. 9A, a bottom electrode layer, an insulator layer and a top electrode layer are sequentially formed. The top and bottom electrodes may comprise a conductive material selected from tungsten, aluminum, AlCu, copper, TiN, TiW, TaN, and combinations thereof. The insulation layer may be formed of dielectric materials such as oxide, SiON, SiN, Hf-containing oxide, Ta-containing oxide, Al-containing oxide, and the like, and preferably has a dielectric constant value of greater than about 5. The stacked layers are then etched to form capacitor 12. A portion of capacitor 12 outside the opening 52 is preferably left un-etched for connecting to a metal line in M1. In other embodiments, as shown in FIG. 9B, the recessed portion of capacitor 12 is filled with a conductive material to form electrode 42. For simplicity, the formation of commonly used diffusion barrier layers has been omitted in FIGS. 9A and 9B.

Figure 10:
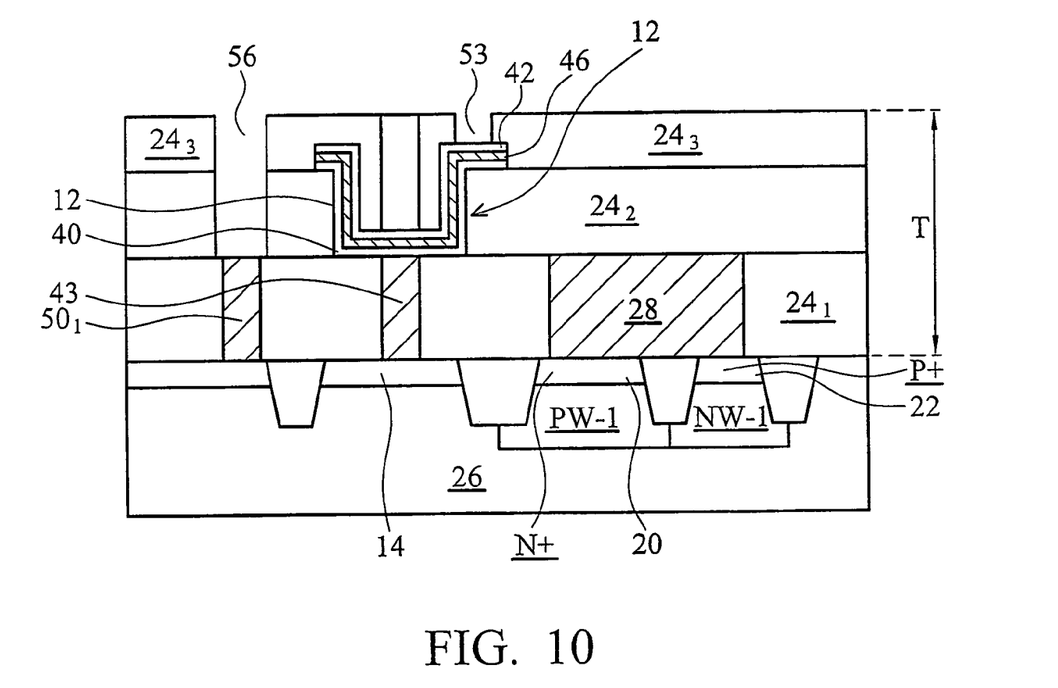

Next, as shown in FIG. 10, a third ILD layer $24_3$ is formed, and an opening 53 is formed to expose the top electrode 42 of capacitor 12. An opening 56 is also formed to expose contact $50_1$ in the logic region. In other embodiments, opening 53 may be formed directly over the recessed portion of capacitor 12, as illustrated with dotted lines. Contacts 48 and $50_2$ are then formed by filling openings 53 and 56, respectively, and the resulting structure has been shown in FIG. 4. It is appreciated that, although there are three ILD layers $24_1$, $24_2$ and $24_3$, the total thickness T is preferably similar to the thickness of typical ILD layers.

Referring back to FIG. 3, the first-layer contact 28 is shown as L-Shaped. Accordingly, first-layer contact 28 has an area at least three times as much as the area of a typical contact, for example, contact 50 (refer to FIG. 4) in the logic circuit. One skilled in the art will realize that contact 28 may have other shapes, such as a rectangular shape.

In FIG. 3, similar to first-layer contact 28, another first-layer contact 58 is formed to connect drain regions of MOS devices PU-2, PD-2 and the gate electrodes of MOS devices PU-1 and PD-1, and further to the source region of the pass gate device PG-2. The formation of first-layer contact 58 is preferably essentially the same as the first layer of the ILD 24.

FIG. 3 also illustrates the contacts of power lines Vcc, Vss and bitlines BL and BLB. Each of contacts preferably includes at least a first contact and a second contact stacked on the first contact, wherein the formation of first contact and the second contact are similar to the contacts $50_1$, and $50_2$ in FIG. 4, respectively. The first contact and the second contact are under and connected to a metal line in the first metallization layer M1. Therefore, vias (not shown) may be needed to further connect the contacts to the overlying metallization layers.

Figure 11:
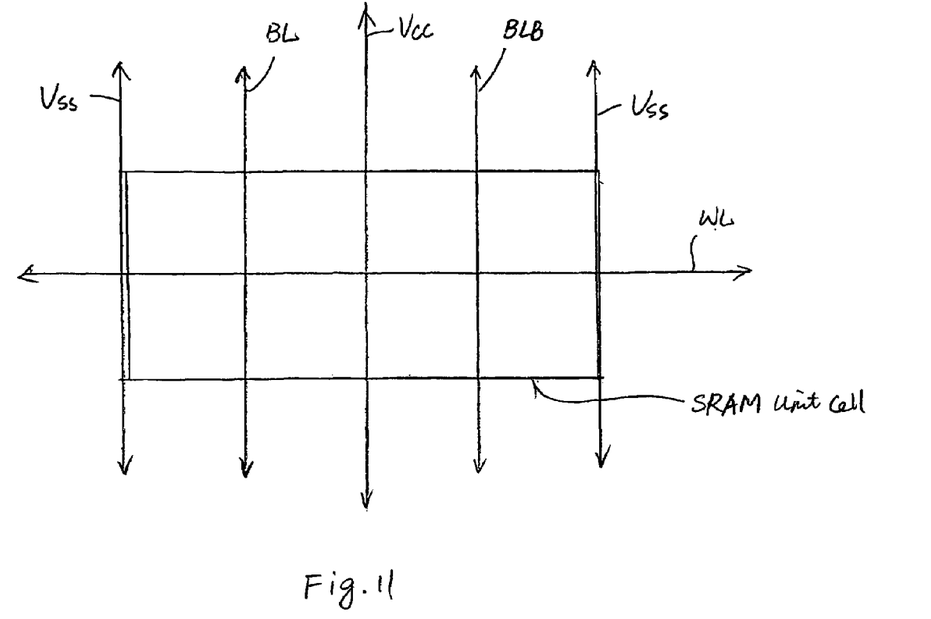
FIGS. 11 and 12 illustrate different metal line layout schemes.

Since the local connection (connections between devices inside a memory cell) is made through first-layer contacts 28 and 58. The first metallization layer M1 may be used for routing other connections. In the preferred embodiment, as shown in FIG. 11, wordline WL is laid out in the first metallization layer M1, while power lines Vcc and Vss and bitlines BL and BLB are laid out in the second metallization layer M2. The SRAM cell thus only needs two metallization layers for routing connection lines. As a comparison, in a conventional SRAM formation process, the first metallization layer M1 is used for the local connections, and M2 and M3 are used for routing Vcc, Vss, BL, and BLB. One metallization layer is thus saved. Preferably, there are two Vss lines, and both are placed along the boundary of the unit cell. Each Vss line is shared by two neighboring unit cells.

Since wordline WL is only used for applying a voltage and thus substantially no current flows through it, while there is current flowing through metal lines Vcc, Vss, BL, and BLB. Preferably the second metallization layer M2 is thicker than the first metallization layer M1 by greater than about 10 percent, and more preferably by greater than about 20 percent.

Figure 12:
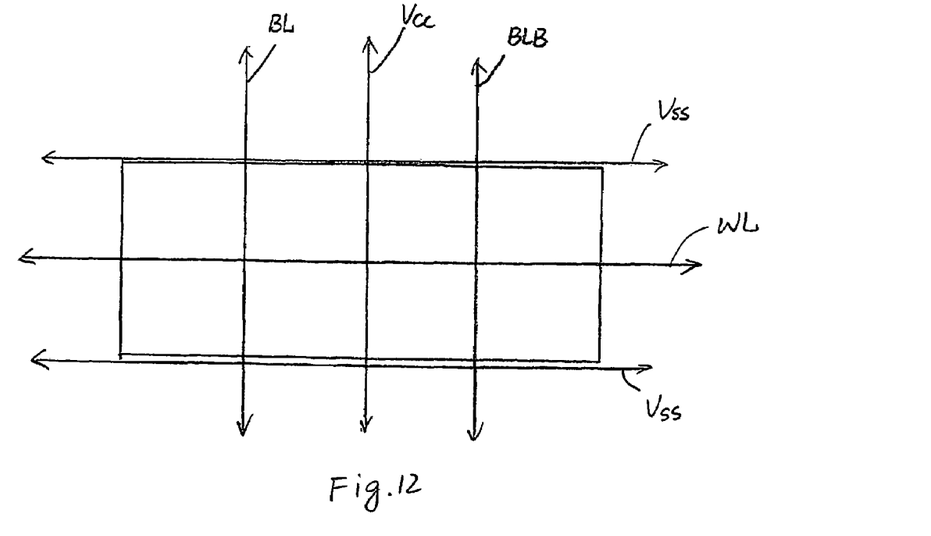

FIG. 12 illustrates an alternative embodiment for routing the connections, wherein wordline WL and two power supplies Vss are laid out in the first metallization layer M1, while power lines Vcc, bitline BL and Bitline-bar BLB are laid out in the second metallization layer M2. One skilled in the art will realize that there are other possible layout combinations. In FIGS. 11 and 12, bitline BL and Bitline-bar BLB are preferably laid out along the direction (width direction) wherein the unit cell is shorter. This way, bitlines are shorter. When memory cells are connected as arrays, the resulting bitlines are also shorter, which reduces the parasitic capacitance between bitlines and neighboring metal lines. An RC delay of reading and writing operations is thus reduced. Again, in the embodiment shown in FIG. 12, the second metallization layer M2 is preferably thicker than the first metallization layer M1 by greater than about ten percent, and more preferably by greater than about 20 percent.

The preferred embodiments of the present invention have several advantageous features. First, by forming first-layer contacts for local connections in memory cells, one metallization layer is saved. Second, first-layer contacts are lower than conventional contacts that extend all the way from the first metallization layer down to source/drain regions, thus, parasitic capacitance is thus reduced and RC delay is reduced. Third, in the preferred embodiment, contacts under and connected to the first metallization layer are formed in at least two stages. This eliminates the need to etch deep openings for contacts. As a result, a bird's beak effect, which is often seen in the formation of deep contacts in dense regions, is significantly reduced. Fourth, since the formation of first-layer contacts is integrated into the formation of capacitors in 1T RAM cells, no extra process steps are needed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
a static random access memory (SRAM) cell comprising a first pull-up MOS device, a first pull-down MOS device and a first pass-gate MOS device;
a first metallization layer;
an inter-layer dielectric (ILD) underlying the first metallization layer, wherein the ILD comprises an upper portion and a lower portion;
a first first-layer contact in the lower portion of the ILD and connecting at least two of the first pull-up MOS device, the first pull-down MOS device and the first pass-gate MOS device, wherein the first first-layer contact is physically isolated from additional contacts in the upper portion of the ILD;

a second first-layer contact in the lower portion of the ILD, wherein the semiconductor structure is free from materials of the ILD directly underlying, and contacting, the first first-layer contact; and a second-layer contact having at least a portion on the second first-layer contact, wherein the second-layer contact electrically connects the second first-layer contact to a bit-line or a power line.

2. The semiconductor structure of claim 1 further comprising a dynamic random access memory (DRAM) cell, wherein the DRAM cell comprises a capacitor formed substantially only in the upper portion of the ILD.

3. The semiconductor structure of claim 1, wherein the first first-layer contact connects a drain region of the first pull-up MOS device, a drain region of the first pull-down MOS device and a source region of the first pass-gate MOS device.

4. The semiconductor structure of claim 3, wherein the first first-layer contact is a butted contact further connecting gate electrodes of a second pull-up MOS device and a second pull-down MOS device.

5. The semiconductor structure of claim 1 further comprising a wordline, two bit-lines, and two power lines directly over the SRAM cell and in the first metallization layer and a second metallization layer, wherein a drain region of the first pass-gate MOS device is connected to one of the bit-lines.

6. The semiconductor structure of claim 1, wherein the bit-line, an inversed bit-line and a Vcc power line are in the first metallization layer.

7. The semiconductor structure of claim 1 further comprising a logic circuit having a plurality of contacts, wherein at least one of the contacts of the logic circuit comprises an upper portion on and connected to a lower portion, and wherein the upper portion of the at least one of the contacts is in the upper portion of the ILD, and the lower portion of the at least one of the contacts is in the lower portion of the ILD.

8. A semiconductor structure comprising:
a static random access memory (SRAM) cell comprising a pull-up MOS device, a pull-down MOS device and a pass-gate MOS device;
an inter-layer dielectric (ILD) over the pull-up MOS device, the pull-down MOS device and the pass-gate MOS device;
a first metallization layer on the ILD, wherein the first metallization layer is a lowest metallization layer;
a first-layer contact in the ILD, wherein a top surface of the first-layer contact is vertically spaced apart from a bottom of the first metallization layer, wherein the first-layer contact interconnects the pull-up MOS device, the pull-down MOS device and the pass-gate MOS device, and wherein the semiconductor structure is free from materials of the ILD directly underlying, and contacting, the first-layer contact;
a dynamic random access (DRAM) cell; and
a capacitor in the DRAM cell, wherein the capacitor is in the ILD and has a bottom surface substantially level with the top surface of the first-layer contact.

9. The semiconductor structure of claim 8 further comprising a logic circuit having a contact, wherein the contact comprises an upper portion and a bottom portion, and wherein the upper portion and the bottom portion have an interface substantially level with the top surface of the first-layer contact.

10. The semiconductor structure of claim 8, wherein the SRAM cell comprises at least six MOS devices, and wherein the DRAM cell comprises at least one transistor.

11. The semiconductor structure of claim 8, wherein the capacitor is a metal-insulator-metal capacitor comprising a top electrode, a bottom electrode and an insulator between the top and the bottom electrodes.

12. The semiconductor structure of claim 11, wherein the top and the bottom electrodes and the first-layer contact comprise a material selected from the group consisting essentially of tungsten, aluminum, AlCu, copper, TiN, TiW, TaN, and combinations thereof.

13. A semiconductor structure comprising:
a semiconductor substrate;
a static random access memory (SRAM) cell comprising a pull-up MOS device, a pull-down MOS device and a pass-gate MOS device at a surface of the semiconductor substrate;
an inter-layer dielectric (ILD) over the pull-up MOS device, the pull-down MOS device and the pass-gate MOS device;
a first metallization layer on the ILD, the first metallization layer being a lowest metallization layer;
a wordline;
a bitline;
an inversed bitline having an inversed phase relative to the bitline;
a Vcc power source line; and
a Vss power source line, wherein the wordline is in the first metallization layer, and wherein the Vcc power source line is in a second metallization layer immediately overlying the first metallization layer.

14. The semiconductor structure of claim 13, wherein the wordline is perpendicular to the bitline and the inversed bitline, and wherein the wordline is in a different metallization layer than the bitline and the inversed bitline.

15. The semiconductor structure of claim 13 further comprising a first-layer contact in the ILD, wherein a top surface of the first-layer contact is lower than a bottom of the first metallization layer, wherein the region between the semiconductor substrate and the first-layer contact is free from materials of the ILD, and wherein the first-layer contact interconnects the pull-up MOS device, the pull-down MOS device and the pass-gate MOS device in the SRAM cell.

16. The semiconductor structure of claim 13, wherein the bitline, the inversed bitline, and the Vss power source line are in the second metallization layer.

17. The semiconductor structure of claim 13, wherein the Vss power source line is in the first metallization layer, and wherein the bitline and the inversed bitline are in the second metallization layer.

18. The semiconductor structure of claim 13, wherein the Vss power source line is substantially directly over a unit cell boundary of the SRAM cell.

* * * * *